(12) United States Patent
Kang et al.

(10) Patent No.: US 7,132,855 B2
(45) Date of Patent: Nov. 7, 2006

(54) LEVEL SHIFT CIRCUIT FOR USE IN SEMICONDUCTOR DEVICE

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 127 days.

(21) Appl. No.: 11/030,615

(22) Filed: Jan. 5, 2005

(65) Prior Publication Data

US 2006/0091908 A1    May 4, 2006

(30) Foreign Application Priority Data

Oct. 30, 2004    (KR) ...................... 10-2004-0087708

(51) Int. Cl.
    *H03K 19/0175* (2006.01)
(52) U.S. Cl. .............................. 326/63; 326/68; 326/81
(58) Field of Classification Search ................ 326/62, 326/63, 68–71, 80–83
    See application file for complete search history.

(56) References Cited

U.S. PATENT DOCUMENTS

| | | | |
|---|---|---|---|
| 4,318,015 A * | 3/1982 | Schade, Jr. ................. | 326/68 |
| 4,486,670 A * | 12/1984 | Chan et al. ................. | 326/81 |
| 5,696,728 A | 12/1997 | Yu et al. | |
| 5,698,993 A * | 12/1997 | Chow .......................... | 326/81 |
| 5,703,522 A | 12/1997 | Arimoto et al. | |
| 5,781,026 A * | 7/1998 | Chow .......................... | 326/26 |
| 5,973,967 A | 10/1999 | Nguyen et al. | |
| 6,160,735 A | 12/2000 | Hirano | |
| 6,351,173 B1 * | 2/2002 | Ovens et al. ............... | 327/333 |
| 6,476,637 B1 * | 11/2002 | Brownlow et al. .......... | 326/81 |
| 6,477,091 B1 | 11/2002 | Tedrow et al. | |
| 6,753,730 B1 | 6/2004 | Yamamoto | |
| 2004/0228192 A1 | 11/2004 | Tedrow et al. | |
| 2004/0257120 A1 * | 12/2004 | Wang et al. .................. | 327/65 |

FOREIGN PATENT DOCUMENTS

| | | |
|---|---|---|
| JP | 2000-174600 | 6/2000 |
| JP | 2002-150784 | 5/2002 |

\* cited by examiner

*Primary Examiner*—Don Le
(74) *Attorney, Agent, or Firm*—Blakely Sokoloff Taylor & Zafman

(57) ABSTRACT

A level shifter for use in a semiconductor device, includes: a first transferring unit for transferring an input signal to an inverted output node in response to a negative voltage; a second transferring unit for supplying a power supply voltage to an output node in response to the input signal; and a third transferring unit coupled to the inverted output node and the output node for supplying the negative voltage to the output node in response to an output of the first transferring unit.

27 Claims, 9 Drawing Sheets

[VDD=1.5V, VNEG=-0.5V]

[VDD=1.2V, VNEG=-0.5V]

[VDD=1.2V, VNEG=-0.5V]

[VDD=0.7V, VNEG=-0.5V]

LEVEL SHIFT CIRCUIT FOR USE IN SEMICONDUCTOR DEVICE

FIELD OF INVENTION

The present invention relates to a level shift circuit; and, more particularly, to a level shift circuit for stably changing a voltage level of a signal reducing power consumption.

DESCRIPTION OF PRIOR ART

Generally, a level shifter is employed in a semiconductor device for changing a voltage level of a signal. Herein, it is desirable to reduce power consumption and delay time for performing a level shifting operation.

FIG. 1 is a schematic circuit diagram showing a conventional level shifter.

As shown, the conventional level shifter includes a first p-type metal oxide semiconductor (PMOS) transistor MP1 one end of which is connected to a power supply voltage VDD for receiving an input signal IN through a gate of the first PMOS transistor MP1; a second PMOS transistor MP2 one end of which is connected to the power supply voltage for receiving an inverted signal of the input signal IN through a gate of the second PMOS transistor; an inverter I1 for inverting the input signal IN; a first n-type metal oxide semiconductor (NMOS) transistor MN1 one end of which is connected to a negative voltage VNEG and the other end of which is connected to the other end of the first PMOS transistor MP1; and a second NMOS transistor MN2 one end of which is connected to the negative voltage VNEG and the other end of which is connected to the other end of the second PMOS transistor MP2.

Herein, an output signal OUT is outputted from a first commonly coupled node between the second PMOS transistor MP2 and the second NMOS transistor MN2. An inverted output signal /OUT is outputted from a second commonly coupled node between the first PMOS transistor MP1 and the first NMOS transistor MN1.

FIGS. 2A and 2B are waveform diagrams showing operations of the conventional level shifter.

Referring to FIGS. 1 to 2B, the operations of the conventional level shifter are described below.

The conventional level shifter receives the input signal IN whose amplitude corresponds to a voltage level from a ground voltage to the power supply voltage VDD. Then, the amplitude of the input signal IN is increased by the conventional level shifter to generate the output signal OUT having amplitude which corresponds to a voltage level from the negative voltage VNEG to the power supply voltage.

When the input signal IN is inputted as a low level, the first PMOS transistor MP1 is turned on and the second PMOS transistor MP2 is turned off, whereby the inverted output signal /OUT is outputted as a high level and the output signal OUT is outputted as a low level. On the contrary, when the input signal IN is inputted as a high level, the first PMOS transistor MP1 is turned off and the second PMOS transistor MP2 is turned on, thus the output signal OUT is outputted as a high level and the inverted output signal /OUT is outputted as a low level. Herein, the low level of the output signal OUT is a voltage level of the negative voltage VNEG and the high level of the output signal OUT is a voltage level of the power supply voltage VDD. That is, the amplitude of the input signal IN is increased by the amount of the negative voltage VNEG.

As shown in FIG. 2A, the input signal IN having the amplitude from the ground voltage, i.e., 0V, to the power supply voltage VDD, i.e., 1.5V, is inputted to the conventional level shifter. Then, the output signal OUT is outputted having the amplitude from the negative voltage VNEG, i.e., −0.5V, to the power supply voltage VDD, i.e., 1.5V.

Meanwhile, as a technology is developed, a semiconductor device is operated with low power and low voltage.

As shown in FIG. 2B, in case that the power supply voltage is low having a voltage level of 1.2V, the conventional level shifter abnormally generates the output signal OUT.

In addition, according to the conventional level shifter, since the first and the second PMOS transistors MP1 and MP2 and the first and the second NMOS transistors MN1 and MN2 are continuously turn on and off, switching currents are generated preventing the conventional level shifter from being stably operated.

SUMMARY OF INVENTION

It is, therefore, an object of the present invention to provide a level shifter which is stably operated at a low power reducing power consumption.

In accordance with an aspect of the present invention, there is provided a level shifter for use in a semiconductor device, including: a first transferring unit for transferring an input signal to an inverted output node in response to a negative voltage; a second transferring unit for supplying a power supply voltage to an output node in response to the input signal; and a third transferring unit coupled to the inverted output node and the output node for supplying the negative voltage to the output node in response to an output of the first transferring unit.

In accordance with another aspect of the present invention, there is provided a level shifter for use in a semiconductor device, including: a first transferring unit for transferring an input signal to an inverted output node in response to a negative voltage; a second transferring unit for supplying a power supply voltage to an output node in response to the input signal; a third transferring unit coupled to the inverted output node and the output node for supplying the negative voltage to the output node in response to an output of the first transferring unit; and a fourth transferring unit for supplying a ground voltage to the output node in response to the output of the first transferring unit and a pulse signal.

In accordance with further another aspect of the present invention, there is provided a level shifter for use in a semiconductor device, including: a first transferring unit for transferring an input signal to an inverted output node in response to a negative voltage; a second transferring unit for supplying a power supply voltage to an output node in response to the input signal; a third transferring unit coupled to the inverted output node and the output node for supplying the negative voltage to the output node in response to an output of the first transferring unit and a second control signal; and a fourth transferring unit for supplying a ground voltage to the output node in response to the output of the first transferring unit and a first control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a level shifter in accordance with the present invention will be described in detail referring to the accompanying drawings.

Figure 1:
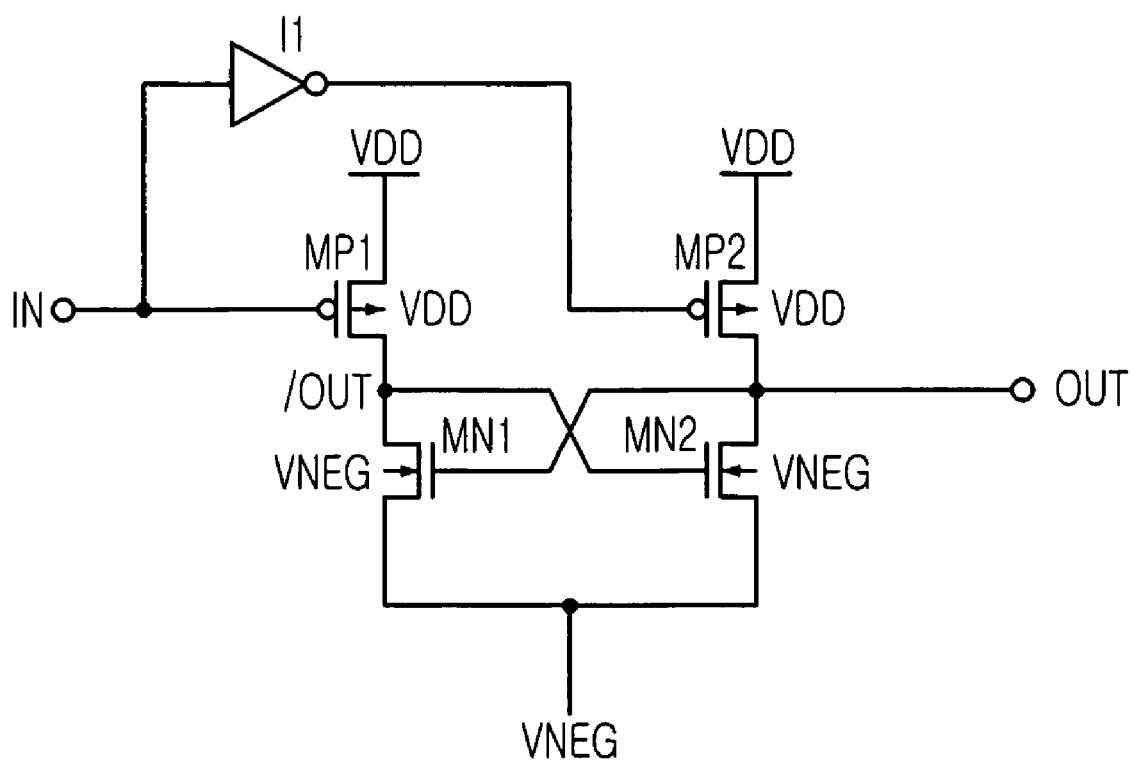
FIG. 1 is a schematic circuit diagram showing a conventional level shifter.
Figure 2A:
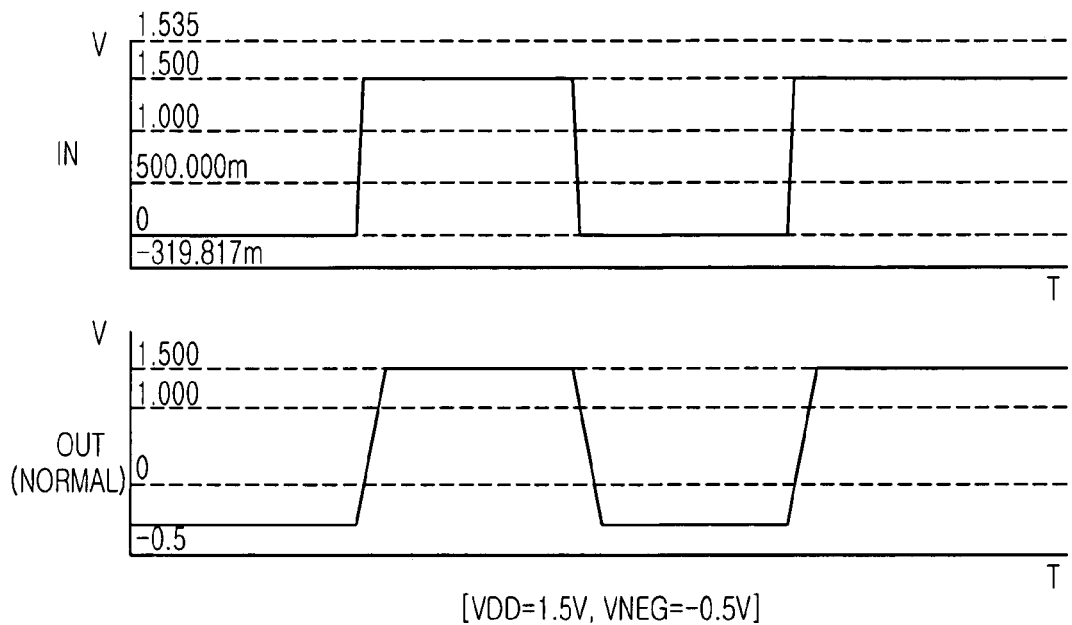
FIGS. 2A and 2B are waveform diagrams showing operations of the conventional level shifter shown in FIG. 1.
Figure 2B:
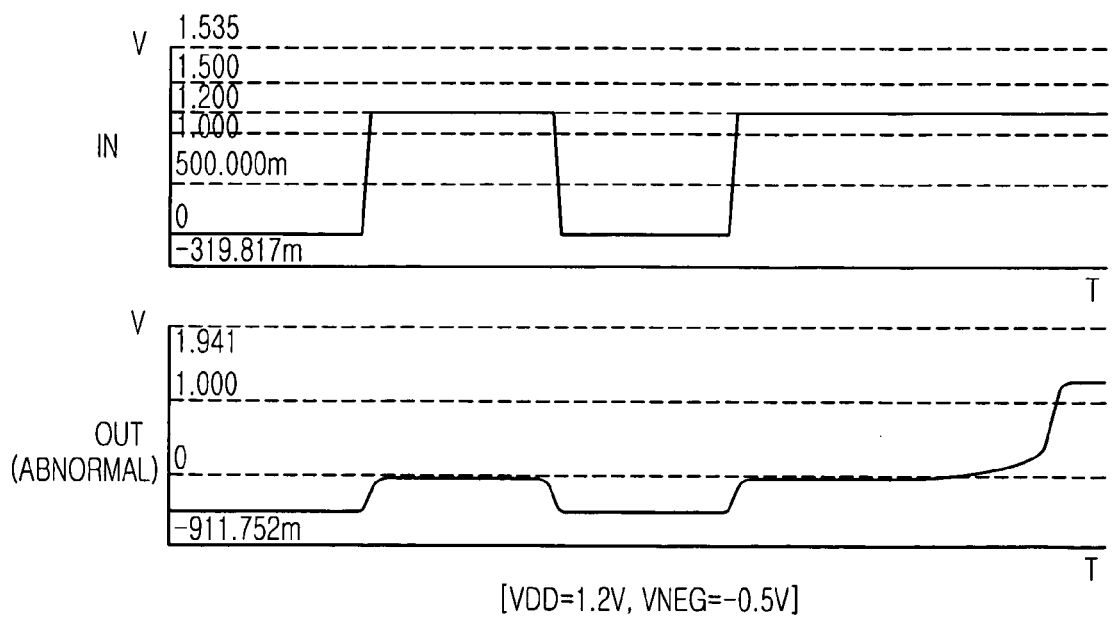
Figure 3:
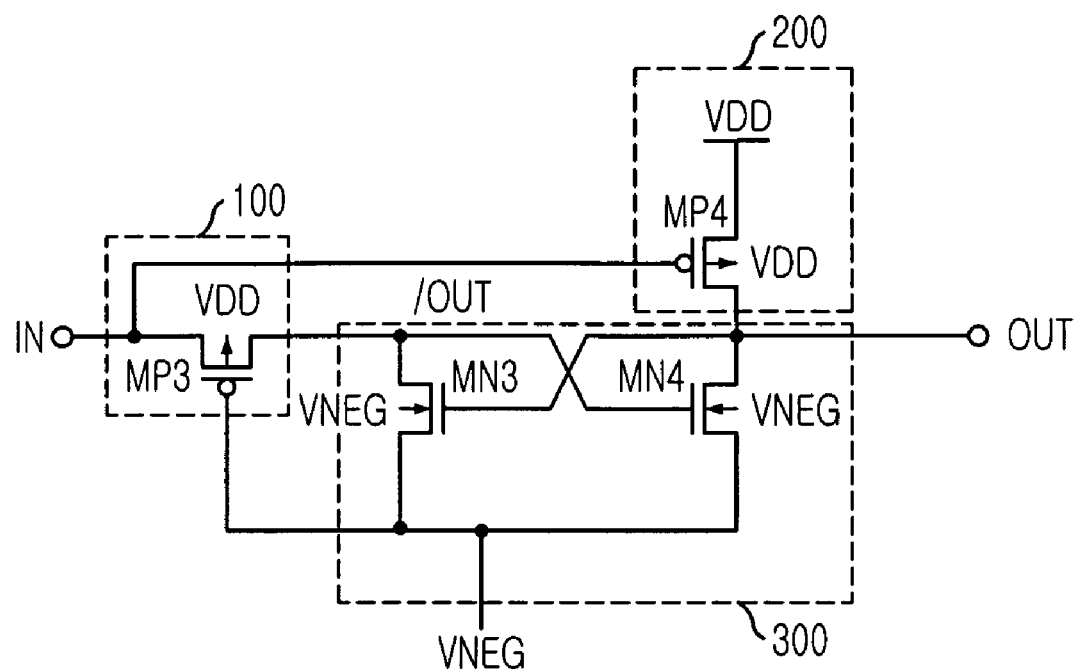
FIG. 3 is a schematic circuit diagram showing a level shifter in accordance with a first embodiment of the present invention.

FIG. 3 is a schematic circuit diagram showing a level shifter in accordance with a first embodiment of the present invention.

As shown, the level shifter includes a first transferring unit 100 for transferring an input signal IN to an inverted output node where an inverted output signal /OUT is outputted; a second transferring unit 200 for supplying a power supply voltage VDD to an output node where an output signal OUT is outputted in response to the input signal IN; and a third transferring unit 300 for connecting a negative voltage VNEG to the output node in response to the inverted output signal /OUT. Herein, it is assumed that a voltage level of the negative voltage VNEG is −0.5V. Also, it is assumed that each bulk terminal of all the p-type metal oxide semiconductor (PMOS) transistors of the level shifter is connected to the power supply voltage VDD and each bulk terminal of all the n-type metal oxide semiconductor (NMOS) transistors of the level shifter is connected to the negative voltage VNEG.

In detail, the first transferring unit 100 includes a first PMOS transistor MP3 for transferring the input signal IN to the inverted output node in response to the negative voltage VNEG.

The second transferring unit 200 includes a second PMOS transistor MP4 for connecting the power supply voltage VDD to the output node in response to the input signal IN.

The third transferring unit 300 includes a first NMOS transistor MN3 connected between the inverted output node and the negative voltage VNEG; and a second NMOS transistor MN4 connected between the output node and the negative voltage VNEG.

Figure 4A:
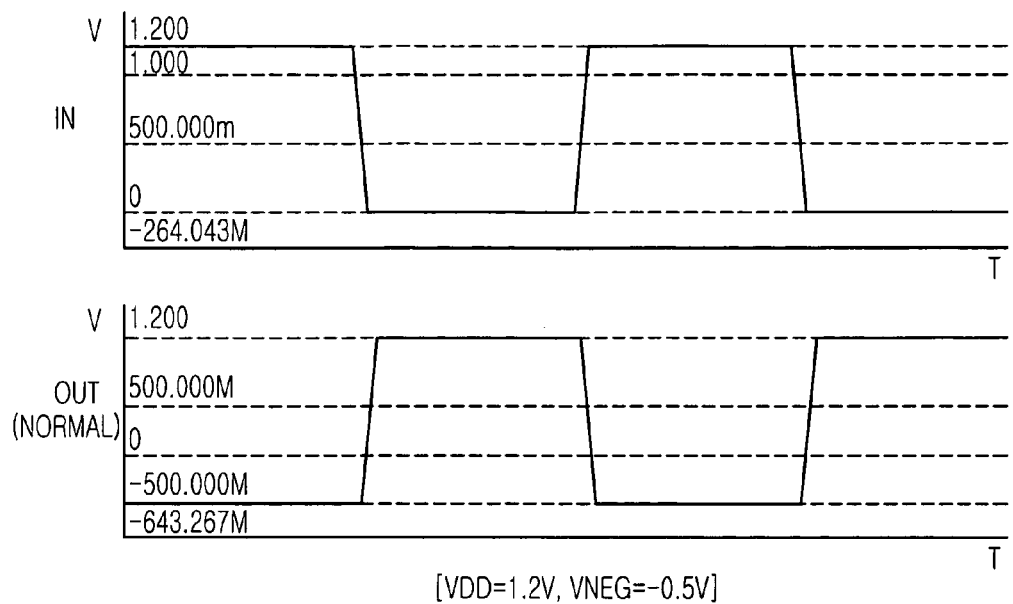
FIGS. 4A and 4B are waveform diagrams showing operations of the level shifter shown in FIG. 3.
Figure 4B:
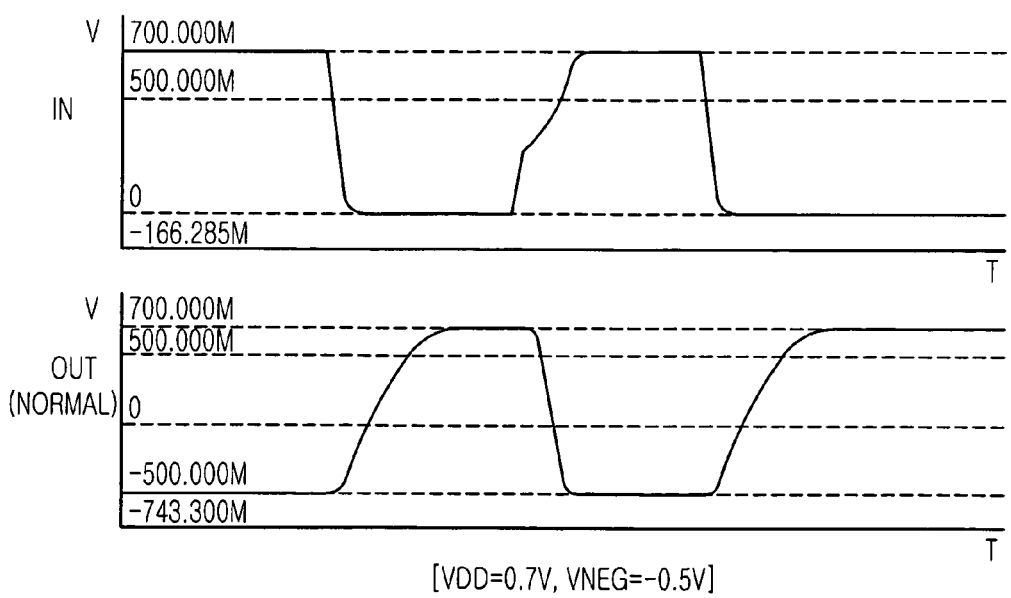

FIGS. 4A and 4B are waveform diagrams showing operations of the level shifter shown in FIG. 3.

Referring to FIGS. 3 to 4B, the operations of the level shifter are described below.

When the input signal IN is a low level, the second PMOS transistor MP4 is turned on to thereby connect the power supply voltage VDD to the output node.

Thereafter, when the input signal IN is a high level, the second PMOS transistor MP4 is turned off and the first PMOS transistor MP3 is turned on, thus the inverted output signal /OUT becomes a high level. Since a gate of the first PMOS transistor MP3 is connected to the negative voltage VNEG, the first PMOS transistor is always turned on.

Since the inverted output signal /OUT is a high level, the second NMOS transistor MN4 is turned on, thus the negative voltage VNEG is connected to the output node. Herein, since the first and the second NMOS transistors MN3 and MN4 are cross-coupled, the inverted output signal /OUT keeps its high level when the output signal OUT becomes a low level.

FIG. 4A is a simulated waveform diagram showing operations of the level shifter in case that the power supply voltage is 1.2V and the negative voltage VNEG is −0.5V. As shown, the output signal OUT is generated having amplitude from the negative voltage VNEG to the power supply voltage VDD when the input signal is IN is inputted having amplitude from the ground voltage to the power supply voltage VDD.

Meanwhile, FIG. 4B is a simulated waveform diagram showing operations of the level shifter in case that the power supply voltage is 0.7V and the negative voltage VNEG is −0.5V. As shown, the output signal OUT is stably generated having amplitude from the negative voltage VNEG to the power supply voltage VDD when the input signal is IN is inputted having amplitude from the ground voltage to the power supply voltage VDD. In comparison with the conventional level shifter, the input signal IN is transferred to the inverted output node without reducing a signal level of the input signal IN, and the inverted output signal /OUT serves to turn on the second NMOS transistor MN4 to thereby connects the negative voltage VNEG to the output node. Therefore, the level shifting operation can be stably performed.

In addition, since the second NMOS transistor MN4 is turned on after the second PMOS transistor MP4 is turned off, a switch current can be reduced. However, according to the conventional level shifter, all the transistors, i.e., the first and the second PMOS transistors MP1 and MP2 and the first and the second NMOS transistors MN1 and MN2, are switched at the same time increasing the switch current.

Accordingly, by applying the level shifter to a semiconductor memory device, a power consumption of the semiconductor memory device can be reduced.

Figure 5:
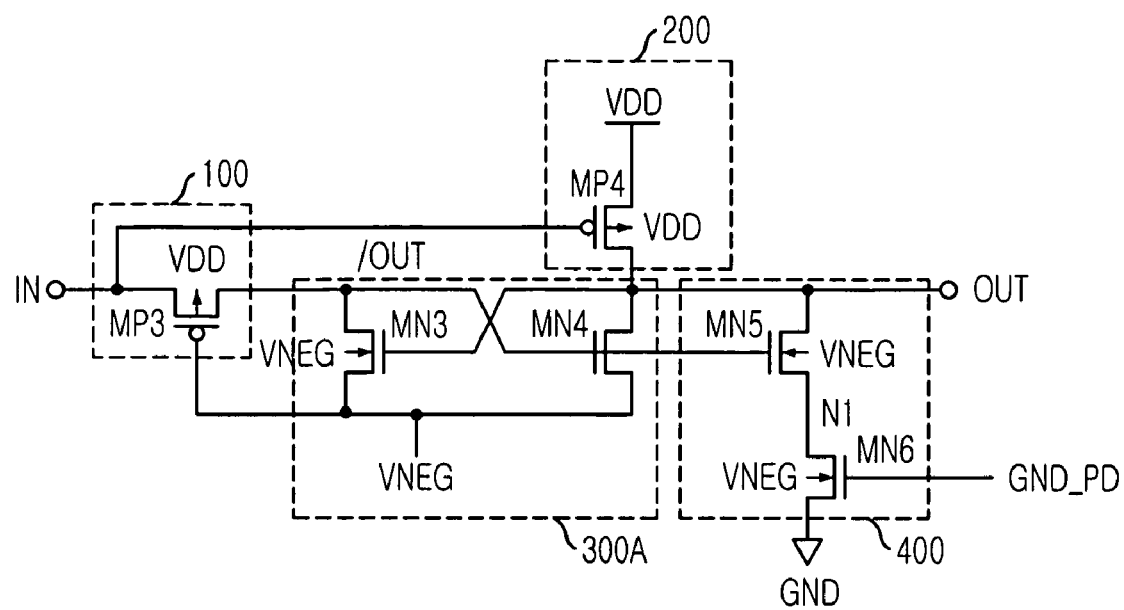
FIG. 5 is a schematic circuit diagram showing a level shifter in accordance with a second embodiment of the present invention.

FIG. 5 is a schematic circuit diagram showing a level shifter in accordance with a second embodiment of the present invention.

As shown, the level shifter includes a first transferring unit 100 for transferring an input signal IN to an inverted output node where an inverted output signal /OUT is outputted; a second transferring unit 200 for supplying a power supply voltage VDD to an output node where an output signal OUT is outputted in response to the input signal IN; a third transferring unit 300A for connecting a negative voltage VNEG to the output node in response to the inverted output signal /OUT; and a fourth transferring unit 400 for connecting a ground voltage GND to the output node according to the input signal IN.

Herein, it is assumed that a voltage level of the negative voltage VNEG is −0.5V. Also, it is assumed that each bulk terminal of all the PMOS transistors of the level shifter is connected to the power supply voltage VDD and each bulk terminal of all the NMOS transistors of level shifter is connected to the negative voltage VNEG.

Meanwhile, a drivability of the fourth transferring unit 400 for supplying the ground voltage GND to the output node is greater than a drivability of the third transferring unit 300A for supplying the negative voltage VNEG to the output node.

In detail, the first transferring unit 100 includes a first PMOS transistor MP3 for transferring the input signal IN to the inverted output node in response to the negative voltage VNEG.

The second transferring unit 200 includes a second PMOS transistor MP4 for supplying the power supply voltage VDD to the output node in response to the input signal IN.

The third transferring unit 300A includes a first NMOS transistor MN3 connected between the inverted output node and the negative voltage VNEG; and a second NMOS transistor MN4 connected between the output node and the negative voltage VNEG.

The fourth transferring unit 400 includes a third NMOS transistor MN5 one end of which is connected to the output node and a gate of which connected to the inverted output node; and a fourth NMOS transistor MN6 one end of which is connected to the ground voltage GND and the other end of which is connected to the other end of the third NMOS transistor MN5 for receiving a pulse signal GND_PD through a gate of the fourth NMOS transistor MN6. Herein, the pulse signal GND_PD is activated as a high level for a predetermined time when a signal level of the input signal IN transitions.

Figure 6:
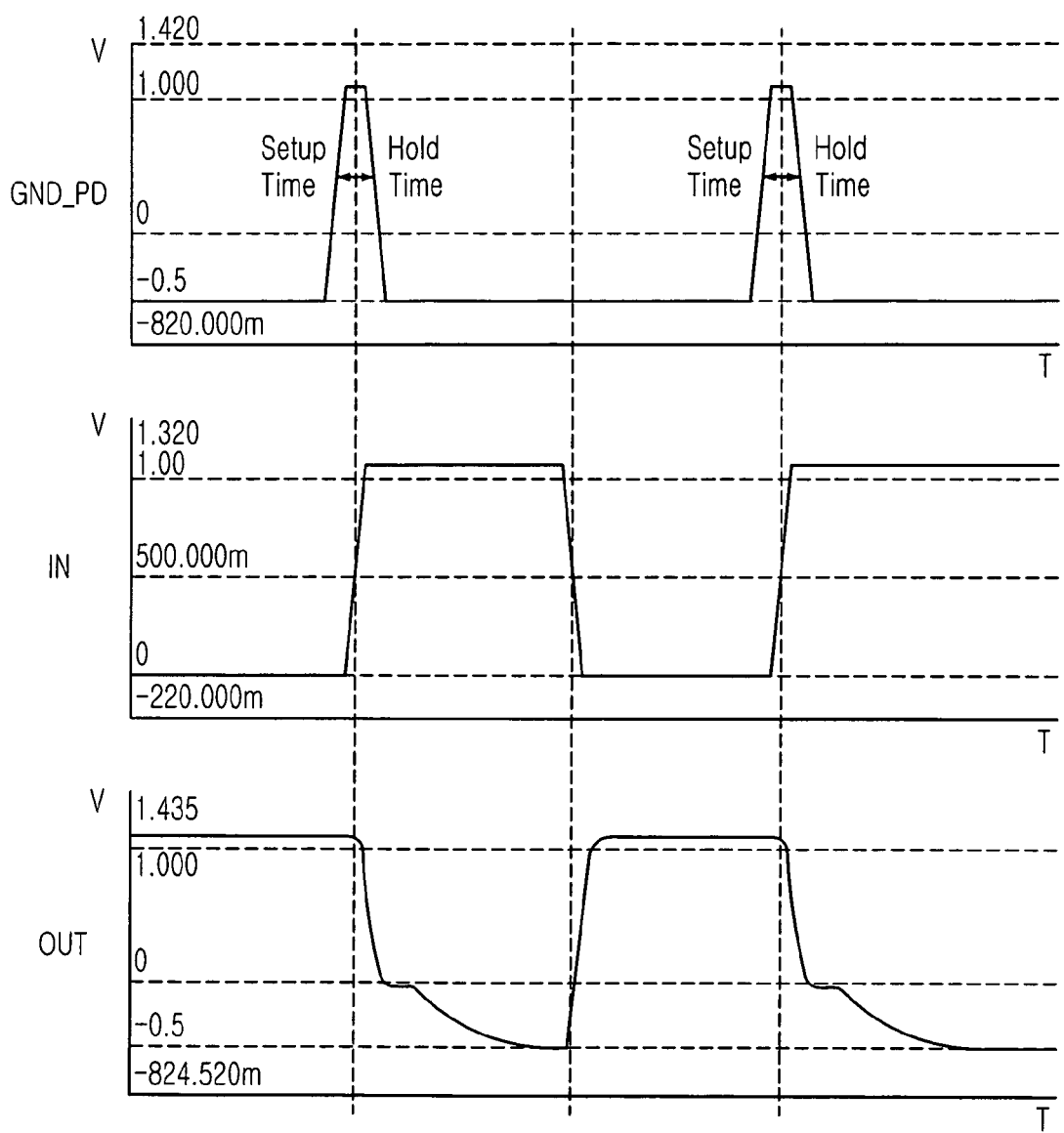
FIG. 6 is a waveform diagram depicting operations of the level shifter shown in FIG. 5.

FIG. 6 is a waveform diagram depicting operations of the level shifter shown in FIG. 5.

Referring to FIGS. 5 and 6, the operations of the level shifter are described below.

When the input signal IN is inputted as a low level, the power supply voltage VDD is supplied to the output node similarly to the level shifter shown in FIG. 3.

When the input signal IN is inputted as a high level, the high level signal is transferred to the inverted output node since the first PMOS transistor MP3 is turned on by the negative voltage VNEG. Then, the second and the third NMOS transistors MN4 and MN5 are turned on.

Meanwhile, the third NMOS transistor MN6 is turned on since the pulse signal GND_PD is a high level when the input signal IN transitions from a low level to a high level.

Accordingly, since both of the third and the fourth NMOS transistors MN5 and MN6 are turned on, the ground voltage GND is connected to the output node.

Meanwhile, since the second NMOS transistor MN4 is turned on, the negative voltage VNEG is also connected to the output node. However, as above-mentioned, since the drivability of the fourth transferring unit 400 is greater than the drivability of the third transferring unit 300A, a voltage level of the output node becomes the ground voltage GND first, and then the voltage level of the output node is decreased to the negative voltage VNEG. By using this method, the switching currents can be reduced since the voltage level of the output node is changed gradationally.

As shown in FIG. 6, the pulse signal GND_PD is activated when the input signal IN transitions. At this time, the pulse width of the pulse signal GND_PD satisfies a setup time and a hold time required for the input signal IN to be changed from a low level to a high level.

Also, it is shown in FIG. 6 that the output signal OUT is generated having the amplitude corresponded to a voltage level from the negative voltage VNEG to the power supply voltage VDD when the input signal IN is inputted to the level shifter having the amplitude corresponded to a voltage level from the ground voltage to the power supply voltage VDD. Herein, when the output signal OUT transitions from a high level to a low level, the signal level of the output signal OUT is decreased having two different slopes. This transition of the output signal OUT is shown in FIG. 7 in detail.

Figure 7:
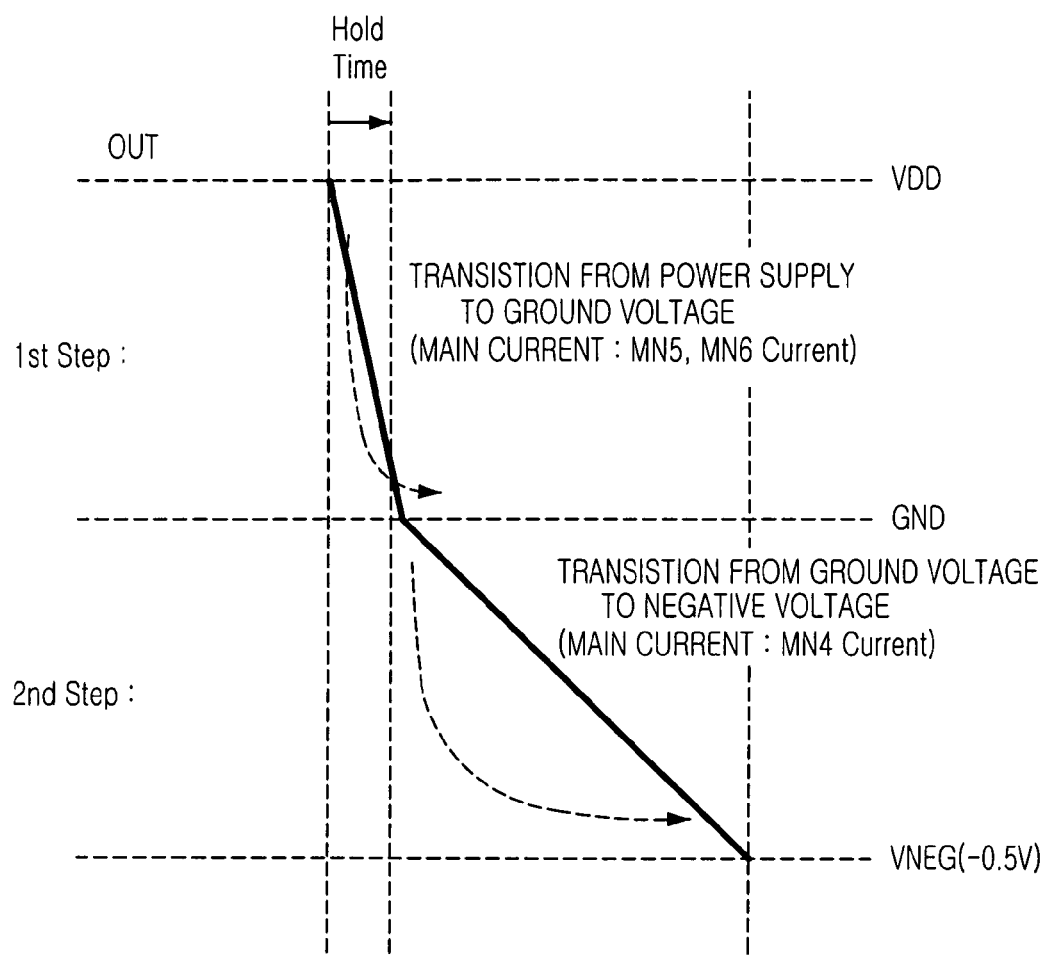
FIG. 7 is a diagram showing a transition of an output signal shown in FIG. 6 in detail.

As shown in FIG. 7, the output signal OUT is decreased having two different slopes at a first step and a second step. During the first step, i.e., when the output signal OUT is decreased from the power supply voltage VDD to the ground voltage GND, a main current is flown through the third and the fourth NMOS transistors MN5 and MN6. Then, during the second step, i.e., when the output signal OUT is decreased from the ground voltage GND to the negative voltage VNEG, the main current is flown through the second NMOS transistor MN4.

As a result, by using the level shifter in accordance with the second embodiment, the level shifting operation can be stably performed reducing power consumption.

Figure 8:
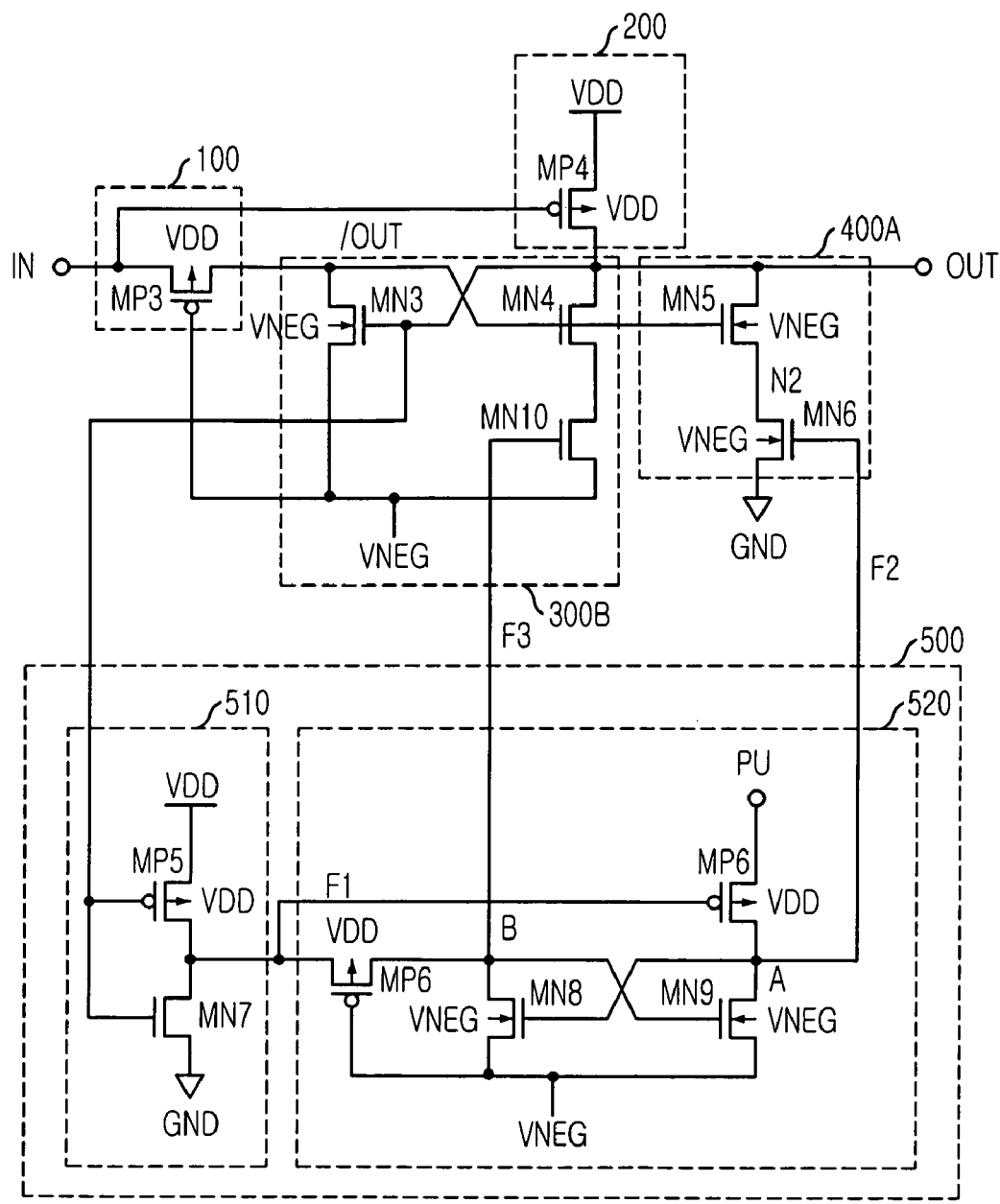
FIG. 8 is a schematic circuit diagram showing a level shifter in accordance with a third embodiment of the present invention.

FIG. 8 is a schematic circuit diagram showing a level shifter in accordance with a third embodiment of the present invention.

As shown, the level shifter includes a first transferring unit 100 for transferring an input signal IN to an inverted output node where an inverted output signal /OUT is outputted; a second transferring unit 200 for supplying a power supply voltage VDD to an output node where an output signal OUT is outputted in response to the input signal IN; a third transferring unit 300B for supplying a negative voltage VNEG to the output node based on the inverted output signal /OUT and a second control signal F3; a fourth transferring unit 400A for connecting a ground voltage GND to the output node based on the inverted output signal /OUT and a first control signal F2; and a control unit 500 for generating the first control signal F2 activated for a first predetermined time when the input signal IN transitions and the second control signal F3 activated for a second predetermined time after the first control signal F2 is inactivated.

Herein, it is assumed that a voltage level of the negative voltage VNEG is −0.5V. Also, it is assumed that each bulk terminal of all the PMOS transistors of the level shifter is connected to the power supply voltage VDD and each bulk terminal of all the NMOS transistors of level shifter is connected to the negative voltage VNEG.

The control unit 500 includes a delay unit 510 and a control signal generation unit 520.

The delay unit 510 receives an output signal outputted from the output node to delay the output signal. The control signal generation unit 520 outputs a pulse signal PU as the first control signal F2 when an output of the delay unit 510 is a low level. The pulse signal PU has a high pulse having a pulse width corresponded to the transition period of the input signal IN. Also, the control signal generation unit 520 generates the second control signal F3 when the output of the delay unit 510 is a high level. The second control signal F3 is activated for the second predetermined time after the first control signal F2 is inactivated.

In detail, the delay unit 510 includes a third PMOS transistor MP5 one end of which is connected to the power supply voltage VDD for receiving the output signal of the output node through a gate of the third PMOS transistor; and a fifth NMOS transistor MN7 one end of which is connected to the ground voltage GND for receiving the output signal of the output node through a gate of the fifth NMOS transistor MN7.

The control signal generation unit 520 includes a fourth PMOS transistor MP6 for outputting the pulse signal PU to a first node A in response to the output of the delay unit 510; a fifth PMOS transistor MP7 one end of which is connected to a second node B and a gate of which is connected to the negative voltage VNEG; a sixth NMOS transistor MN8 connected between the second node B and the negative voltage VNEG; and a seventh NMOS transistor MN9 connected between the first node A and the negative voltage VNEG. Herein, a gate of the sixth NMOS transistor MN8 is coupled to the first node A and a gate of the seventh NMOS transistor MN9 is coupled to the second node B.

The first transferring unit 100 includes a first PMOS transistor MP3 for transferring the input signal IN to the inverted output node in response to the negative voltage VNEG.

The second transferring unit 200 includes a second PMOS transistor MP4 for supplying the power supply voltage VDD to the output node in response to the input signal IN.

The third transferring unit 300B includes a first NMOS transistor MN3, a second NMOS transistor MN4 and an eighth NMOS transistor MN10. The first NMOS transistor MN3 is connected between the inverted output node and the negative voltage node VNEG and a gate of the first NMOS transistor MN3 is connected to the output node. The second NMOS transistor MN4 is connected between the output node and the eighth NMOS transistor and a gate of the second NMOS transistor MN4 is coupled to the inverted output node. The eighth NMOS transistor MN10 is connected between the second NMOS transistor MN4 and the negative voltage VNEG, and a gate of the eighth NMOS transistor MN4 is coupled to the second node B for receiving the second control signal F3.

The fourth transferring unit 400A includes a third NMOS transistor MN5 one end of which is connected to the output node and a gate of which is coupled to the inverted output node; and a fourth NMOS transistor MN6 connected between the third NMOS transistor MN5 and the ground voltage GND for receiving the first control signal F2 through a gate of the fourth NMOS transistor MN6.

Figure 9:
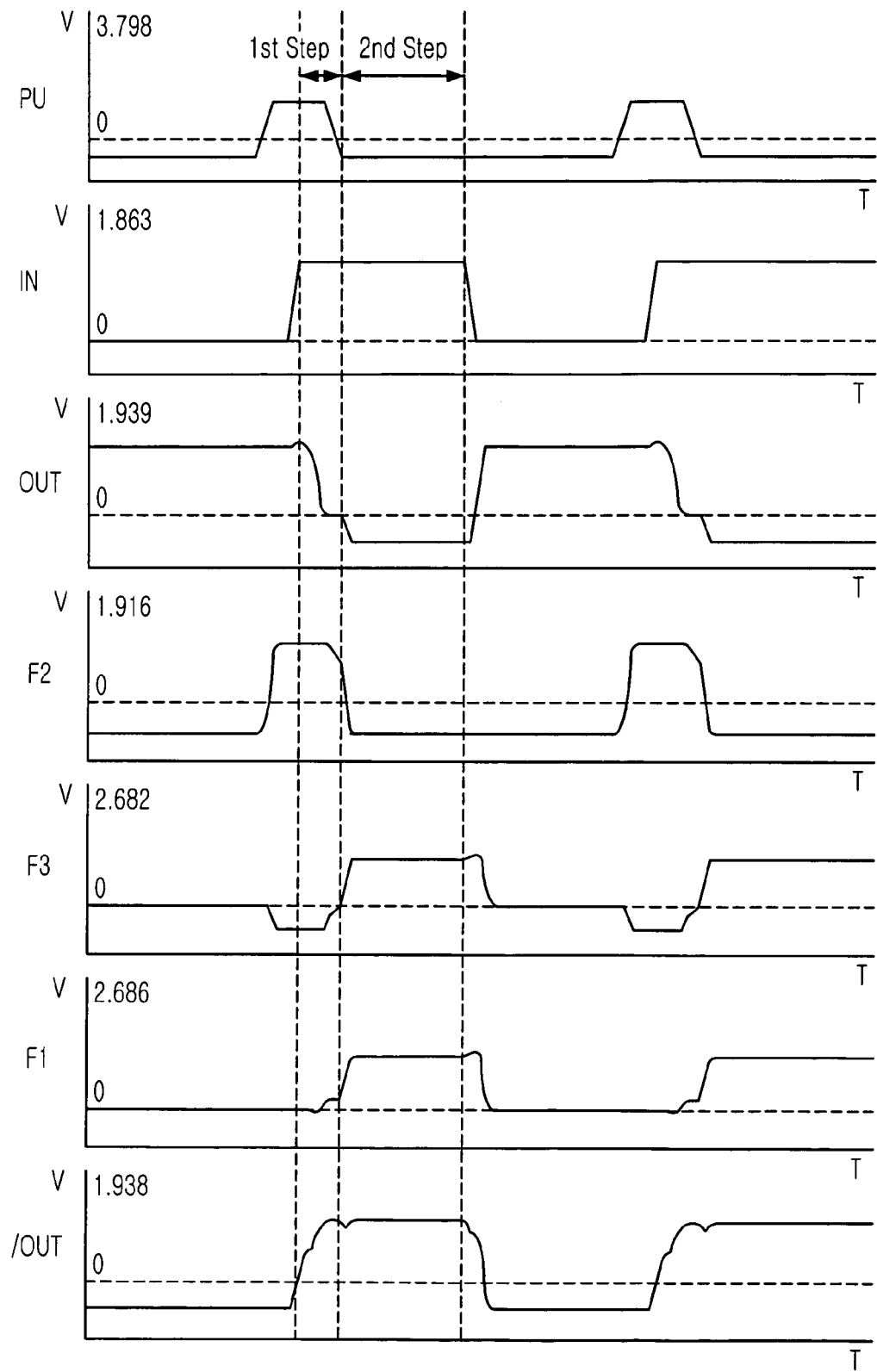
FIG. 9 is a waveform diagram showing operations of the level shifter shown in FIG. 8.

FIG. 9 is a waveform diagram showing operations of the level shifter shown in FIG. 8.

Referring to FIG. 8 and 9, the operations of the level shifter are described below.

When the input signal IN is inputted as a low level, the operations of the level shifter are same to those of the level shifters according to the first and the second embodiment.

In case that the input signal IN is a high level, the operations of the level shifter are described below.

Since the input signal IN is a high level, the second and the third NMOS transistors MN4 and MN5 are turned on.

Meanwhile, when the input signal IN is a low level right before the input signal IN is changed to a high level, a signal level of the output node is a high level. Accordingly, the output of the delay unit 510 is a low level, thus the fourth PMOS transistor MP6 is turned on. Therefore, the first control signal F2 is a high level according to the pulse signal PU. The pulse signal PU has a high pulse whose pulse width corresponded to the transition period of the input signal IN. That is, the pulse signal PU keeps its signal level as a high level while the input signal IN changed from a high level to a low level. Subsequently, the first control signal F2 is a high level during the transition period of the input signal IN.

As a result, the fourth NMOS transistor MN6 is turned on and the signal level of the output node decreased to the ground voltage.

Also, at this time, since the first node A is in a high level, the sixth NMOS transistor MN8 is turned on and the second node B is in a low level. Therefore, the second control signal F3 is outputted as a low level, whereby the eighth NMOS transistor MN10 is turned on.

Therefore, when the input signal IN is changed from a low level to a high level, the third transferring unit 300B is disabled and the fourth transferring unit 400A is enabled for a predetermined time, and thus the signal level of the output node is decreased to the ground voltage level.

Thereafter, the signal level of the output node becomes the ground voltage level, and thus the output of the delay unit 510 becomes a high level. Accordingly, the fourth PMOS transistor MP6 is turned off and the seventh NMOS transistor MN9 is turned on. At this time, the fifth PMOS transistor MP7 is still turned on since the gate of the fifth PMOS transistor MP7 is connected to the negative voltage VNEG.

Therefore, the first and the second nodes A and B become a low level and a high level respectively, whereby the first and the second control signals F2 and F3 are outputted as a low level and a high level respectively.

Subsequently, the fourth NMOS transistor MN6 is turned off and the eighth NMOS transistor MN10 is turned on. That is, after the output node becomes the ground voltage level, the fourth transferring unit 400A is disabled and the third transferring unit 300B is enabled.

Thereafter, the signal level of the output node is decreased from the ground voltage level to the negative voltage level by the third transferring unit 300B.

FIG. 9 shows the above-mentioned operations of the level shifter.

As shown, the pulse signal PU stays in a high level while the input signal IN transitions from a low level to a high level. It is also shown that the first control signal F2 is firstly activated, then the second control signal F3 is activated after the first control signal F2 is inactivated.

The output signal OUT is increased having a constant slope when the output signal OUT is changed from a low level to a high level. However, when the output signal OUT is changed from a high level to a low level, the output signal OUT is decreased having tow different slopes. That is, the output signal OUT is decreased from the power supply voltage VDD to the ground voltage level having a first slope by the fourth transferring unit 400A. Then, the output signal OUT is decreased from the ground voltage level to the negative voltage level by the third transferring unit 300B. Herein, the enabling timing of the fourth transferring unit 400A and the enabling timing of the third transferring unit 300 are controlled by the delay unit 510. That is, by adjusting a drivability of the third PMOS transistor MP5 and a drivability of the fifth NMOS transistor MN7, the enabling timings of the third and the fourth transferring units 300B and 400A are controlled.

As described above, the operations of the level shifter shown in FIG. 8 are similar to those of the level shifter shown in FIG. 5. That is, when the output signal OUT is changed from a high level to a low level, the output signal OUT is decreased from the power supply voltage level to the ground voltage level having a first slope, then the output signal OUT is decreased from the ground voltage level to the negative voltage level having a second slope. However, while the third transferring unit 300B of the level shifter shown in FIG. 8 is disabled when the output signal OUT is decreased from the power supply voltage level to the ground voltage level, the third transferring unit 300A of the level shifter shown in FIG. 5 is enabled when the output signal OUT is decreased from the power supply voltage level to the ground voltage level consuming power. Accordingly, the power consumption can be more reduced by using the level shifter according to the third embodiment.

Therefore, in accordance with the present invention, a level shifter for use in a semiconductor device can be stably operated at a low voltage reducing power consumption. In particular, the level shifter in accordance with the present invention can be stably operated at a low voltage having a voltage level of about 1.2V to 0.7V. Accordingly, by using the level shifter in accordance with the present invention, a low voltage semiconductor device can be more easily developed.

The present application contains subject matter related to Korean patent application No. 2004-87708, filed in the Korean Patent Office on Oct. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A level shifter for use in a semiconductor device, comprising:
   a first transferring unit for transferring an input signal to an inverted output node in response to a negative voltage;
   a second transferring unit for supplying a power supply voltage to an output node in response to the input signal; and
   a third transferring unit coupled to the inverted output node and the output node for supplying the negative voltage to the output node in response to an output of the first transferring unit.

2. The level shifter as recited in claim 1, wherein the first transferring unit includes:
   a first PMOS transistor one end of which receives the input signal and a gate of which is coupled to the negative voltage.

3. The level shifter as recited in claim 2, wherein the second transferring unit includes:
   a second PMOS transistor connected between the power supply voltage and the output node for receiving the input signal through a gate of the second PMOS transistor.

4. The level shifter as recited in claim 3, wherein the third transferring unit includes:
   a first NMOS transistor connected between the inverted output node and the negative voltage for receiving the output of the first transferring unit through the inverted output node; and
   a second NMOS transistor connected between the output node and the negative voltage for receiving the output of the first transferring unit through a gate of the second NMOS transistor.

5. The level shifter as recited in claim 4, wherein the gate of the second NMOS transistor is coupled to the inverted output node and a gate of the first NMOS transistor is coupled to the output node.

6. A level shifter for use in a semiconductor device, comprising:
   a first transferring unit for transferring an input signal to an inverted output node in response to a negative voltage;
   a second transferring unit for supplying a power supply voltage to an output node in response to the input signal;
   a third transferring unit coupled to the inverted output node and the output node for supplying the negative voltage to the output node in response to an output of the first transferring unit; and
   a fourth transferring unit for supplying a ground voltage to the output node in response to the output of the first transferring unit and a pulse signal.

7. The level shifter as recited in claim 6, wherein the pulse signal becomes a high pulse when the input signal is changed from a low level to a high level and a pulse width of the high pulse corresponds to a setup time and a hole time required for the input signal to be changed from a low level to a high level.

8. The level shifter as recited in claim 7, wherein a drivability of the fourth transferring unit for supplying the ground voltage to the output node is greater than a drivability of the third transferring unit for supplying the negative voltage to the output node.

9. The level shifter as recited in claim 8, wherein a signal level of the output node is decreased from a power supply voltage level to a ground voltage level by the fourth transferring unit and is decreased from the ground voltage level to a negative voltage level by the third transferring unit when an output signal of the output node is changed from a high level to a low level.

10. The level shifter as recited in claim 9, wherein the first transferring unit includes:
    a first PMOS transistor one end of which receives the input signal and a gate of which is coupled to the negative voltage.

11. The level shifter as recited in claim 10, wherein the second transferring unit includes:
    a second PMOS transistor connected between the power supply voltage and the output node for receiving the input signal through a gate of the second PMOS transistor.

12. The level shifter as recited in claim 11, wherein the third transferring unit includes:
    a first NMOS transistor connected between the inverted output node and the negative voltage for receiving the output of the first transferring unit through the inverted output node; and
    a second NMOS transistor connected between the output node and the negative voltage for receiving the output of the first transferring unit through a gate of the second NMOS transistor.

13. The level shifter as recited in claim 12, wherein the gate of the second NMOS transistor is coupled to the inverted output node and a gate of the first NMOS transistor is coupled to the output node.

14. The level shifter as recited in claim 13, wherein the fourth transferring unit includes:
    a third NMOS transistor one end of which is connected to the output node and a gate of which connected to the inverted output node; and
    a fourth NMOS transistor one end of which is connected to the ground voltage and the other end of which is connected to the other end of the third NMOS transistor for receiving the pulse signal through a gate of the fourth NMOS transistor.

15. A level shifter for use in a semiconductor device, comprising:
    a first transferring unit for transferring an input signal to an inverted output node in response to a negative voltage;
    a second transferring unit for supplying a power supply voltage to an output node in response to the input signal;
    a third transferring unit coupled to the inverted output node and the output node for supplying the negative voltage to the output node in response to an output of the first transferring unit and a second control signal; and a fourth transferring unit for supplying a ground voltage to the output node in response to the output of the first transferring unit and a first control signal.

16. The level shifter as recited in claim 15, wherein the output signal of the output node is decreased from a power supply voltage level to a ground voltage level by the fourth transferring unit and is decreased from the ground voltage level to a negative voltage level by the third transferring unit when the output signal of the output node is changed from a high level to a low level.

17. The level shifter as recited in claim 15, wherein the third transferring unit is disabled when the fourth transferring unit is enabled by the first control signal and the fourth transferring unit is disabled when the third transferring unit is enabled by the second control signal.

18. The level shifter as recited in claim 17, further comprising:
a control unit for generating the first control signal and the second control signal based on an output signal of the output node.

19. The level shifter as recited in claim 18, wherein the control unit includes:
a delay unit for delaying the output signal of the output node;
a control signal generation unit for receiving an output of the delay unit and a pulse signal to generate the first control signal and the second control signal.

20. The level shifter as recited in claim 19, wherein the pulse signal stays in a high level when the input signal is changed from a high level to a low level.

21. The level shifter as recited in claim 20, wherein the delay unit includes:
a third PMOS transistor one end of which is connected to the power supply voltage for receiving the output signal of the output node through a gate of the third PMOS transistor; and
a fifth NMOS transistor one end of which is connected to the ground voltage for receiving the output signal of the output node through a gate of the fifth NMOS transistor.

22. The level shifter as recited in claim 21, wherein the control unit includes:
a fourth PMOS transistor for outputting the pulse signal as the first control signal in response to the output of the delay unit;
a fifth PMOS transistor one end of which receives the output of the delay unit and a gate of which is connected to the negative voltage;

a sixth NMOS transistor connected one end of which is connected to the other end of the fifth PMOS transistor and the other end of which is connected to the negative voltage; and
a seventh NMOS transistor connected between the fourth PMOS transistor and the negative voltage VNEG.

23. The level shifter as recited in claim 22, wherein the first transferring unit includes:
a first PMOS transistor one end of which receives the input signal and a gate of which is coupled to the negative voltage.

24. The level shifter as recited in claim 23, wherein the second transferring unit includes:
a second PMOS transistor connected between the power supply voltage and the output node for receiving the input signal through a gate of the second PMOS transistor.

25. The level shifter as recited in claim 24, wherein the third transferring unit includes:
a first NMOS transistor connected between the inverted output node and the negative voltage for receiving the output of the first transferring unit through the inverted output node; and
a second NMOS transistor connected between the output node and the negative voltage for receiving the output of the first transferring unit through a gate of the second NMOS transistor.

26. The level shifter as recited in claim 25, wherein the gate of the second NMOS transistor is coupled to the inverted output node and a gate of the first NMOS transistor is coupled to the output node.

27. The level shifter as recited in claim 26, wherein the fourth transferring unit includes:
a third NMOS transistor one end of which is connected to the output node and a gate of which connected to the inverted output node; and
a fourth NMOS transistor one end of which is connected to the ground voltage and the other end of which is connected to the other end of the third NMOS transistor for receiving the pulse signal through a gate of the fourth NMOS transistor.

* * * * *